United States Patent [19]

Murakami et al.

[11] 4,105,456
[45] Aug. 8, 1978

[54] CERAMIC MATERIAL OF LOW THERMAL EXPANSION COEFFICIENT AND METHOD OF MANUFACTURING THE SAME

[75] Inventors: Toshiaki Murakami, Hino; Shigeru Waku, Tokyo; Akira Demura, Tokorozawa; Toshiaki Fujishiro, Tokyo, all of Japan

[73] Assignees: Nippon Telegraph & Telephone Public Corporation, Tokyo; Nippon Tsushin Kogyo Kabushiki Kaisha, Kawasaki, both of Japan

[21] Appl. No.: 758,813

[22] Filed: Jan. 12, 1977

[30] Foreign Application Priority Data

Feb. 4, 1976 [JP] Japan ................................. 51-10417

[51] Int. Cl.² ............................................ C04B 33/26
[52] U.S. Cl. ..................................... 106/46; 106/73.3; 106/73.32; 106/73.4; 106/73.5; 428/428; 428/446
[58] Field of Search ..................... 106/57, 46; 252/520

[56] References Cited

U.S. PATENT DOCUMENTS

| | | | |
|---|---|---|---|
| 2,559,381 | 7/1951 | Wainer | 106/46 |
| 3,585,390 | 6/1971 | Ishikawa | 106/57 |
| 3,804,649 | 4/1974 | Manigault | 106/57 |
| 3,948,813 | 4/1976 | Holcombe et al. | 106/57 X |

FOREIGN PATENT DOCUMENTS

| | | | |
|---|---|---|---|
| 45-6,525 | 3/1970 | Japan | 106/38.9 |
| 888,227 | 1/1962 | United Kingdom | 106/57 |

OTHER PUBLICATIONS

Ceramic Industry – Jan. 1967 – pp. 82–83 and p. 103 for "Clay Ball", Kaolin and Kaolin, Calcined.
Searle, A. B., "Refractory Materials" – (1950), pub. Chas Griffin & Co., Ltd., London, pp. 94–96 and 185.
Beranger, G. et al., "Modifications de Structure de la Zircone Pure ou All iee par le Passage d'un Courant Electrique Continu a Haute Temperature" – Rev. Hautes Temper et Refract. t. 3, 1966, pp. 235–242.

*Primary Examiner*—Helen M. McCarthy
*Attorney, Agent, or Firm*—Burns, Doane, Swecker & Mathis

[57] ABSTRACT

A process for producing ceramics to be used as substrates and packages of semiconductor devices, which having a thermal expansion coefficient close to that of silicon used as chip or wafer material of large scale integrations and a mechanical strength and thermal conductivity equal to those of alumina, wherein zircon and clays such as kaolin, ball clay and the like and an additive of one of $Li_2O$, $TiO_2$ and ZnO and another of CoO, $Co_2O_3$, $Co_3O_4$ and MgO are mixed, molded and fired.

8 Claims, 7 Drawing Figures

CERAMIC MATERIAL OF LOW THERMAL EXPANSION COEFFICIENT AND METHOD OF MANUFACTURING THE SAME

This invention relates to ceramics of low thermal expansion coefficient and, more particularly, to a process for producing ceramics to be used as substrates and packages for mounting thereon integrated circuits (IC), large scale integrations (LSI) or the like.

Alumina $Al_2O_3$ has been generally used already for this kind of uses and, specifically in the case of multilayer alumina substrate, mostly alumina of a purity of 92% (with an addition of a small amount of MgO, $SiO_2$ and the like) has been used. In the case of hybrid integrated circuits, it is necessary that the surface roughness should be less than 1 μm and for this purpose alumina of such superhigh purity as of about 99% has been used. Further in the case of high heat dissipation of transistors, beryllium oxide which is high in thermal conductivity will be optionally used as the substrate.

According to "Solid Logic Technology" of International Business Machines Corp. (known as SLT of IBM; see an article by P. A. Totta in Proceedings of Electronic Components Conference, page 275, 1971), in mounting semiconductor chips to the substrate, leads for connecting respective terminals provided on the chips and substrate are connected with each other by heating and fusing together. In such case, as the thermal expansion coefficients of the substrate and chips are different from each other, certain stress will be produced in the connecting terminal parts and, particularly when chip size is large, it is said that such connecting parts may be breakable or damageable. It is considered as a countermeasure against it to use a flexible solder for the chips but this is not to be a fundamental solution of the problem. Even if a silicon wafer is used as a substrate in order to conform the thermal expansion coefficient of the substrate to that of the chips, there are still problems left unsolved in respect of electric insulation and holding manner for the substrate.

With the increase of the number of elements of LSI chips, the heat dissipation of the chips will also increase and, in order to improve the heat dissipation, it will be often adopted to solder reverse surface of the chip to the substrate. In this connection, Olson et al. report (IEEE Trans. vol. PHP 7, No. 2, 76, 1971) that, due to the difference between the respective thermal expansion coefficients of the substrate and chip, the stress produced between them will become so large with the increase of the chip size that the chip elements will be broken or peeled off depending on temperature cycles.

As materials having a thermal expansion coefficient close to that of silicon, there are Kovar (thermal expansion coefficient $\alpha = 5.5 \times 10^{-6}/°C$), Invar ($\alpha = 2.7 \times 10^{-6}/°C$), molybdenum ($\alpha = 4.9 \times 10^{-6}/°C$) and the like, but in the event when the substrate is made with these materials it becomes necessary to provide a wiring plate separately. The present invention has been suggested to remove these defects of the prior art as described above.

A primary object of the present invention is to provide a manufacturing process for easily obtaining a ceramic substrate of a thermal expansion coefficient of a value close to that of silicon and of a mechanical strength and thermal conductivity of values close to those of alumina (of the purity of 92%).

Other objects and advantages of the present invention shall be made clear upon reading following disclosures of the invention.

According to the present invention, a process for manufacturing ceramics for semiconductor devices is provided, which comprising steps of adding to zircon ($ZrSiO_4$), calcined kaolin ($Al_2O_3 \cdot 2SiO_2$) of generally 5 - 30% by weight and specifically optimumly 6.00 - 25.00% by weight, further adding thereto and mixing therewith a material selected from a group I or respective groups I and II consisting of following additives:

| | Additives | Adding Amount Range (% by weight) |
|---|---|---|
| Group I | $Li_2O$ | generally 1 – 5, and optimumly 1.50 – 2.00 |
| | $TiO_2$ | generally 1 – 10, and optimumly 1.90 – 3.80 |
| | ZnO | generally 2 – 10, and optimumly 3.50 – 5.50 |
| Group II | CoO | generally 2 – 15, and optimumly 3.50 – 8.00 |
| | $Co_2O_3$ | generally 2 – 15, and optimumly 3.50 – 8.00 |
| | $Co_3O_4$ | generally 2 – 15, and optimumly 3.50 – 8.00 |
| | MgO | generally 1 – 5, and optimumly 1.10 – 2.50 | molding the mixture obtained by the foregoing step, and firing thus obtained mold at a temperature of 1200° - 1450° C.

In the above, clays such as kaolin, ball clay and the like may be added without being calcined, and the respective additives in the groups I and II may not be required to be compounds in the form of oxide but may be such compounds which are changed to oxides when heated as carbonates, hydroxides, nitrates, oxalates and the like, or even may be added as compounds in the form of such compounds with zircon as, for example, $MgZrSiO_5$ and $ZnZrSiO_5$.

The present invention shall now be explained in detail with reference to certain embodiments shown in accompanying drawings, in which.

Figure 1:
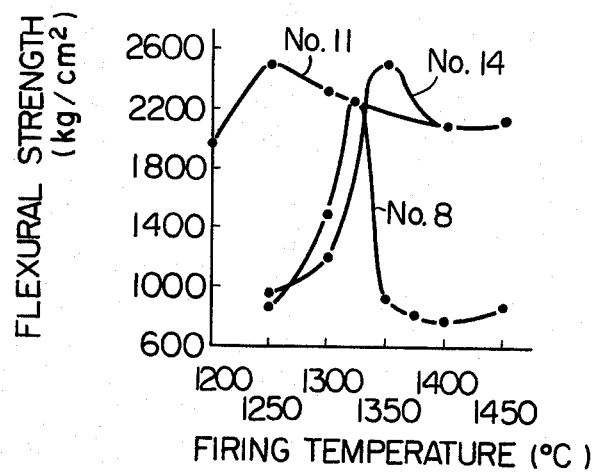
FIG. 1 is a diagram showing relations between firing temperature and flexural strength of different compositions.

The thermal expansion coefficient $\alpha$ of zircon ceramics ($ZrSiO_4$) is about $4.5 \times 10^{-6}/°C$ and is larger than the value of 2.5 to $3.2 \times 10^{-6}/°C$ of silicon while its thermal conductivity and mechanical strength have values next to those of alumina ceramic substrate. In the present invention, it has been successful to simultaneously solve the problem of improving the sintering characteristics or sinterability of zircon and the problem of reducing the thermal expansion coefficient.

First of all, certain experiments made for the purposes of improving the sintering characteristics of zircon and increasing its mechanical strength shall be explained. Now, powdery $MgZrSiO_5$, $Co_2O_3$, $Li_2Co_3$, $ZnZrSiO_5$ and $TiO_2$ were added to zircon powder, respective mixtures were molded and the ceramics thus obtained were fired. Respective compositions are as shown in Table 1A attached hereto.

Average particle size of zircon and kaolin in the above (obtained by calcining $Al_2O_3 \cdot 2SiO_2 \cdot 2H_2O$ and removing crystallization water) were respectively 0.8 μm and 5 μm.

Weighed raw materials were wet-mixed in a pot mill with an addition of water or alcohol, dried, and thereafter calcined at 1100° C for 2 hours. This calcined product was again wet-crushed in the pot mill and dried to be a powdery raw material. The material was then molded and fired at a temperature of 1200° – 1450° C for 2 hours in an electric furnace. Relations of bulk specific gravity, flexural strength and firing temperature of the thus obtained test piece are shown in Table 2 also attached hereto.

Measurements of the flexural strength were performed as follows with respect to the above test piece:

A square-sectioned bar of 27 × 3 × 1 mm was used as a test piece. The bar was mounted on two knife edges arranged at a spacing of 2 mm. Another knife edge was applied to load the test piece in the middle part from above to determine the maximum breaking load. The flexural strength was determined from this by calculation. The obained value is the average value with respect to 4 to 5 test pieces.

The flexural strength of conventional zircon ceramics is 1540 kg/cm$^2$ but the above mentioned compositions Nos. 1, 2 and 3 are all of values above 2000 kg/cm$^2$ and thus excellent in practical use. It is found from the above results that only $MgZrSiO_5$ and $Co_2O_3$ can be used as additives for mineralizers to improve the sintering characteristics. In the case of $Co_2O_3$, it was possible to obtain the same result by adding CoO or $Co_3O_4$ in place of $Co_2O_3$.

Then, compounds of Li, Ti, Zn and the like were used as additives to obtain ceramics of a structure wherein crystalline grains of zircon were surrounded by a substance of an expansion coefficient smaller than that of silicon to reduce the thermal expansion coefficient to be close to that of silicon. The compositions are shown by the respective compositions Nos. 5 to 10 in Table 1A, whereas the respective thermal expansion coefficients α are shown in Table 3 further attached hereto.

In the Table 3, the indication $\alpha_{25\text{-}100}$, for example, represents an average expansion coefficient in the range of 25° – 100° C. In performing the measurements, thermal expansion $\Delta l$ of a test piece of a length $l$ was determined in the range of 0° to 500° C and the thermal expansion coefficient α based on 25° C as a standard was determined by the following formula:

$$\alpha_{25\text{-}T} = \frac{\Delta l}{(T\text{-}25) \times l}$$

The value is also an average value with respct to 4 to 5 test pieces.

It is found from this result that effects of the compositions Nos. 5 and 8 ($Li_2CO_3$ as additives) are so high that their thermal expansion coefficients are very close to that of silicon. Effects of the compositions Nos. 7, 10 ($TiO_2$ as additives) and 6 ($ZnZrSiO_5$ as an additive) can be also recognized. This is considered to be for a reason that such compound as eucryptite ($Li_2O.Al_2O_3.2SiO_2$) or spodumene ($Li_2O.Al_2O_3.4SiO_2$), aluminum titanate ($Al_2TiO_5$), a zinc compound ($2ZnO.2Al_2O_3.5SiO_2$) and the like surrounds the grains of zircon ($ZrSiO_4$) in crystalline boundary around the crystalline grains so as to reduce the thermal expansion coefficient of the entire ceramics.

On the basis of experimental results using the foregoing simple additive, certain cases employing respectively a plurality of additives were investigated for the improvements of the thermal expansion coefficient and mechanical strength. Compositions tested here were as in Table 1B which is a continuation of Table 1A and which is further attached hereto.

As a result of the tests, it was recognized that the compositions Nos. 11 and 14 have shown excellent effects. The relations of the firing conditions and physical characteristics of the three kinds of the compositions Nos. 8, 11 and 14 are shown in Table 4 attached hereto.

The same as in the case of general ceramics, the firing contraction coefficient will become high with increases of the firing temperature up to a certain temperature but will reduce when the temperature is further elevated.

FIG. 1 shows relations between the flexural strength and the firing temperature in the respective three cases of the compositions Nos. 8, 11 and 14. The compositions Nos. 8 and 14 show peaks at 1300° to 1350° C, while the composition No. 11 shows to be larger in an expanse of the ridge and higher in the effect on the sintering of CoO than the compositions Nos. 8 and 14. In such case, the temperature operation will be easy to make uniform ceramics high in the flexural strength. On the other hand, it is recognized that the composition No. 8 will be large in variations in respective characteristics due to the firing temperature and the flexural strength in the case of this composition will become high only in a narrow firing range.

Figure 2:
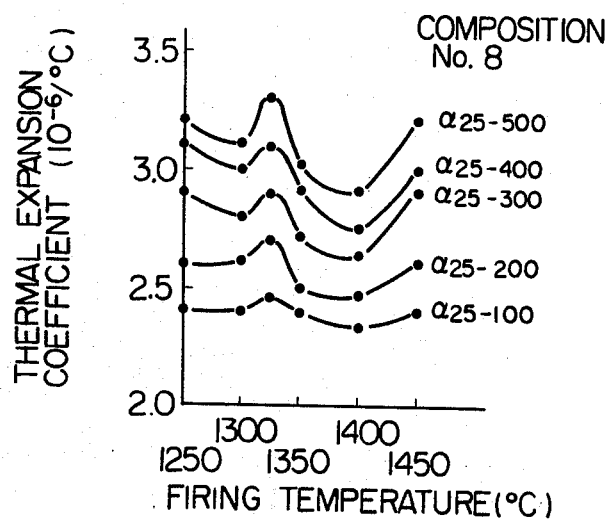
FIGS. 2 to 4 are diagrams showing relations between the firing temperature and thermal expansion coefficient of the different compositions of FIG. 1.
Figure 3:
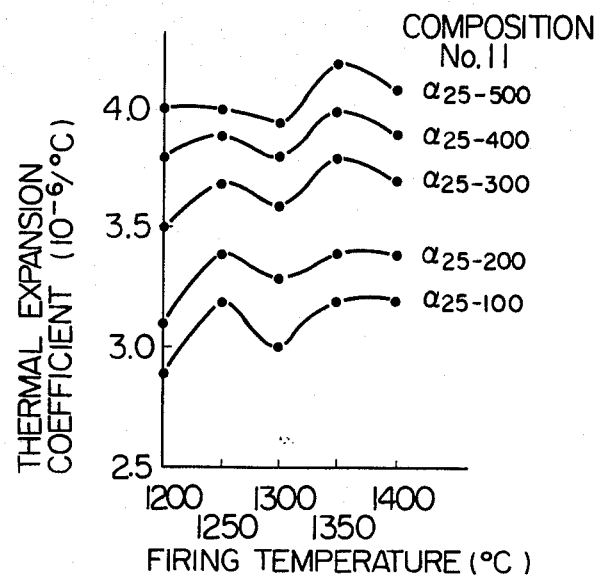
Figure 4:
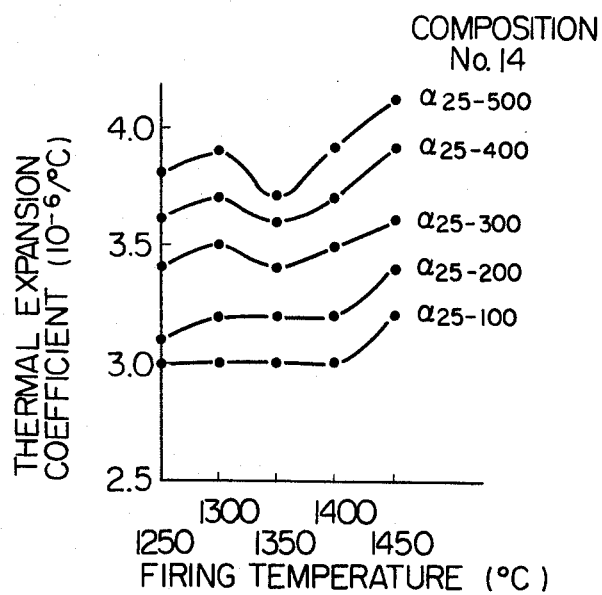

In FIGS. 2 to 4, there are shown diagramatically relations between the firing temperature and the thermal expansion coefficient in the respective cases of the compositions Nos. 8, 11 and 14, the thermal expansion coefficient α in which is an average value in the respective temperature ranges between 25° C and each of 100°, 200°, 300°, 400° and 500° C. It is seen that the thermal expansion coefficient of the composition No. 8, fired at a temperature of 1325° C, substantially coincides with that of silicon, the thermal expansion coefficient of silicon being:

| | |
|---|---|
| α0–100 | 2.5 × 10$^{-6}$/° C |
| α0–200 | 2.6 × 10$^{-6}$/° C |
| α0–300 | 2.8 × 10$^{-6}$/° C |
| α0–400 | 3.0 × 10$^{-6}$/° C |
| α0–500 | 3.2 × 10$^{-6}$/° C |

It is also seen that the thermal expansion coefficients of composition Nos. 11 and 14 when fired at temperatures of 1300° and 1350° C, respectively, will become close to that of silicon.

EXAMPLE I 71.40 g of zircon ($ZrSiO_4$ of an average granularity of 0.8 μm) and 24.36 g of kaolin ($Al_2O_3.2SiO_2.2H_2O$) calcined at 1000° C for one hour were made a main raw material, to which 4.24 g of $Li_2CO_3$ were added. They were wet-mixed in a pot mill, dried and thereafter calcined at 1100° C for 2 hours. Thus obtained calcined product was again wet-crushed in the pot mill and dried to obtain a raw material powder, which was dry-molded and fired at 1325° C for 2 hours in an electric furnace. The characteristics of the thus obtained product are shown in Table 4 attached hereto as the composition No. 8. It was possible also to obtain a product having almost identical characteristics to the case of using kaolin even when ball clay was used instead of kaolin.

EXAMPLE II 5.57 g of $CoCO_3$ and 12.5 g of $ZnZrSiO_5$ were added to 71.38 g of zircon and 12.50 g of a powder obtained by calcining kaolin at 1000° C. This mixture was wet-mixed in a pot mill, dried and thereafter calcined at 1100° C for 2 hours. The calcined product was again wet-crushed in the pot mill and dried to obtain a raw material powder. From a slurry prepared with this powder, a plurality of sheet materials respectively of a thickness of about 0.2 mm were made by a doctor blade method. A multi-layer sheet material made by heaping up some of the above sheets and rolling up the same was punched to be of a predetermined form and fired at 1300° C for 2 hours in an electric furnace. The characteristics of the thus obtained product are shown in Table 4 as the composition No. 11. It was also possible to obtain a product having almost identical characteristics to the above even when a mixture of ZnO and $ZrSiO_4$ of corresponding amount to $ZnZrSiO_5$ was added instead of the latter.

EXAMPLE III 1.90 g of $TiO_2$ and 6.25 g of $MgZrSiO_5$ were added to 79.35 g of zircon and 12.5 g of calcined kaolin. The mixture was wet-mixed in a pot mill, dehydrated and then calcined at 1100° C for 2 hours. The calcined product was again wet-crushed in the pot mill and dried to obtain a raw material powder. Sheets of a thickness of about 0.2 mm each were made by a doctor blade method from a slurry prepared from the raw material powder. A multi-layer sheet material made by heaping and rolling up some of the sheets was punched to be of a predetermined form and fired at 1300° C for 2 hours in an electric furnace. The characteristics of the thus obtained product are shown in Table 4 as the composition 14. It was also possible to obtain a product having almost identical characteristics to the above even when magnesium oxalate and $ZrSiO_4$ of corresponding amount to that of $MgZrSiO_5$ was employed instead of the latter.

Figure 5:
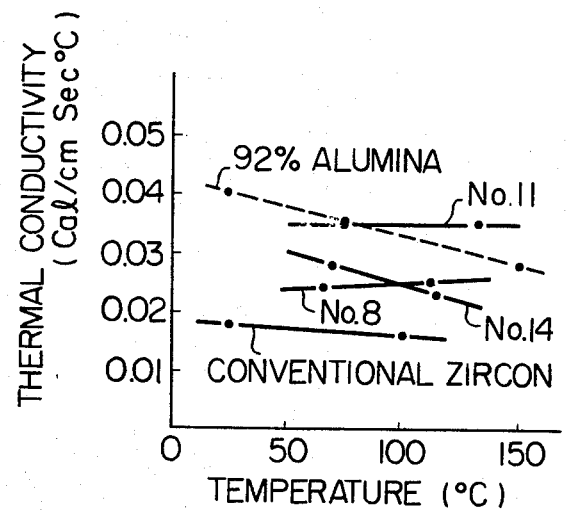
FIG. 5 is a diagram showing relations between thermal conductivity and temperature of the different compositions of FIG. 1 and 92% purity alumina.

In FIG. 5, the thermal conductivities of the respective compositions Nos. 8, 11 and 14 are shown in comparison with those of 92% alumina and conventional zircon. Particularly that of the composition No. 11 is of the same degree as the 92% alumina and is considerably improved as compared with that of the conventional zircon.

Figure 6A:
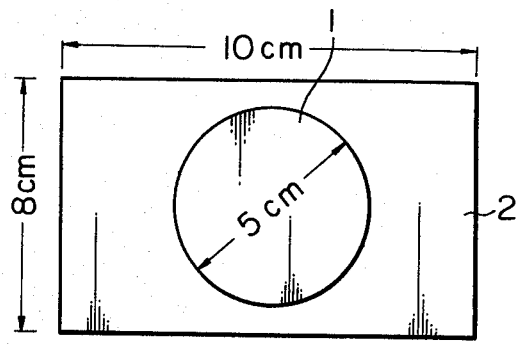
FIGS. 6A and 6B are a plan view and a side elevation of a sample made by bonding a silicon wafer to a substrate for explaining flexure performance thereof.
Figure 6B:
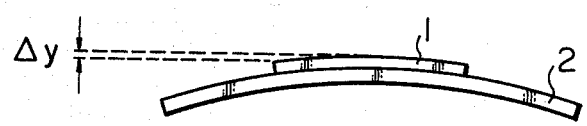

FIGS. 6A and 6B are to show the flexure in the case where a silicon wafer is bonded to a substrate. In order to measure practically the flexure, a disk of a diameter of 5 cm and thickness of 0.38 mm as a silicon plate 1 was bonded to a substrate of a width of 8 cm, length of 10 cm and thickness of 1 mm with a eutectic solder (of a melting point of 300° C), and the flexure $\Delta y$ was measured with respect to different samples employing the substrates prepared by using 92% alumina and the composition No. 11 of the present invention. Results were:

In the case of alumina: $\Delta y = 150$ μm
In the case of Composition No. 11: $\Delta y = 13$ μm Thus the present invention can be recognized to be excellent also in respect of the flexure. As evident from Table 4, it is found that a product very high in the thermal conductiviyy and mechanical strength and close to silicon in the thermal expansion can be obtained according to the present invention.

In the present invention, the compositions in the following ranges are used:

Such clays as calcined kaolin, ball clay and the like ($Al_2O.2SiO_2$): 5.00 to 30.00% by weight.

The above substances are to form a substance of a low thermal expansion around zircon particles together with $Li_2O$, $TiO_2$, ZnO and the like. When the substance is less than 5.00% by weight, the thermal expansion will not be small enough and, when it is above 30% by weight, the firing temperature will rise so that complete firing will become difficult to achieve. It should be noted that the optimum composition will be 6 to 25% by weight.

$Li_2O$: 1.00 TO 5.00% BY WEIGHT

This substance is to form $Li_2O.Al_2O_3.2SiO_2$ or $Li_2O.Al_2O_3.4SiO_2$ together with kaolin. If the same is less than 1% by weight, the thermal expansion coefficient will not reduce to be low enough and will become higher than that of silicon by more than $0.5 \times 10^{-6}/°$ C. In the case it is more than 5.00% by weight, the thermal expansion coefficient will become lower than that of silicon by more than $0.5 \times 10^{-6}/°$ C, so that the firing temperature range will be extremely narrow and practical industrialization will become difficult. The optimum composition range should be 1.5 to 2.0% by weight.

$TiO_2$: 1.00 TO 10.00% BY WEIGHT

This substance is to surround zircon by forming $Al_2TiO_5$ together with $Al_2O_3$ of clay. If the same is less than 1.00% by weight, the thermal expansion coefficient will become higher than that of silicon by more than $0.7 \times 10^{-6}/°$ C and, if it is more than 10.00% by weight, the dielectric constant of the ceramics will become higher than 12 and the insulation resistance will reduce. The optimum range should be 1.9 to 3.8% by weight for this substance.

ZnO: 2.00 TO 10.00% BY WEIGHT

This substance is to form around zircon a compound of a low thermal expansion coefficient containing ZnO together with $Al_2O_3.2SiO_2$ of clay. If the substance is less than 2.00% by weight, it will become higher than silicon by more than $0.8 \times 10^{-6}/°$ C in the thermal expansion coefficient and, if the same is more than 10.00% by weight, the sintering characteristics will be low and the flexural strength will not be able to be made more than 2000 kg/cm². The optimum composition range should be 3.5 to 5.5% by weight for this substance.

CoO, $Co_2O_3$ AND $Co_3O_4$: 2.00 TO 15.00% BY WEIGHT

These substances are to be added to improve the sintering characteristics or sinterability of the ceramics. If they are less than the above range, the sintering will be insufficient and, if they are more than the above range, the dielectric loss will be large. The optimum range for each of CoO, $Co_2O_3$ and $Co_3O_4$ should be 3.50 to 8.00% by weight.

MgO: 1.00 TO 5.00% BY WEIGHT

This substance is to be added for the purpose of accelerating the sintering. If the substance is less than 1.00% by weight, the sintering will not proceed and, if the same is more than 5.00% by weight, the crystalline grains will become too large and the flexural strength will reduce. Thus the adding amount of MgO was determined from the point at which the flexural strength remains above 2000 kg/cm². The optimum composition range for this substance should be 1.10 to 2.50% by weight.

TABLE 1A

| Compositions (wt. %) Components | 1 | 2 | 3 | 4 | 5 | 6 | 7 | 8 | 9 | 10 |
|---|---|---|---|---|---|---|---|---|---|---|
| Zircon | 75.00 | 62.50 | 83.55 | 79.75 | 83.50 | 75.00 | 83.70 | 71.40 | 62.50 | 71.20 |
| Kaolin | 12.50 | 25.00 | 12.47 | 12.40 | 12.18 | 12.50 | 12.50 | 24.36 | 25.00 | 25.00 |
| Additive | $MgZrSiO_5$ 12.50 | $MgZrSiO_5$ 12.50 | $Co_2O_3$ 3.98 | $Co_2O_3$ 7.85 | $Li_2CO_3$ 4.32 | $ZnZrSiO_5$ 12.50 | $TiO_2$ 3.80 | $Li_2CO_3$ 4.24 | $ZnZrSiO_5$ 12.50 | $TiO_2$ 3.80 |

TABLE 2

| ITEMS \ COMPOSITIONS | 1 | 2 | 3 | 4 |
|---|---|---|---|---|
| Bulk specific gravity | 4.02 | 3.92 | 3.98 | 4.03 |
| Flexural strength $Kg/cm^2$ | 2020 | 2180 | 2200 | 1640 |
| Firing temperature °C | 1350 | 1400 | 1400 | 1400 |

TABLE 3

| Composition No. | $\alpha_{25-100}$ | $\alpha_{25-200}$ | $\alpha_{25-300}$ | $\alpha_{25-400}$ | $\alpha_{25-500}$ ($10^{-6}$/°C) |
|---|---|---|---|---|---|
| 5 | 2.3 | 2.6 | 2.8 | 2.8 | 3.0 |
| 6 | 3.0 | 3.2 | 3.5 | 3.7 | 3.9 |
| 7 | 2.9 | 3.2 | 3.5 | 3.8 | 3.9 |
| 8 | 2.3 | 2.3 | 2.6 | 2.8 | 2.9 |
| 9 | 3.2 | 3.6 | 3.8 | 4.0 | 4.1 |
| 10 | 2.9 | 3.2 | 3.5 | 3.7 | 3.8 |

TABLE 1B

| Composition No. (wt. %) Component | 11 | 12 | 13 | 14 | 15 |
|---|---|---|---|---|---|
| Zircon | 71.38 | 67.58 | 71.20 | 79.35 | 85.60 |
| Kaolin | 12.50 | 25.00 | 12.50 | 12.50 | 6.25 |
| Additives | CoO 3.62<br>$ZnZrSiO_5$ 12.50 | CoO 3.62<br>$TiO_2$ 3.80 | $MgZrSiO_5$ 12.50<br>$TiO_2$ 3.80 | $MgZrSiO_5$ 6.25<br>$TiO_2$ 1.9 | $MgZrSiO_5$ 6.25<br>$TiO_2$ 1.9 |

TABLE 4

| Item | Composition | No. 8 | No. 11 | No. 14 | Conventional Zircon | 92% Alumina |
|---|---|---|---|---|---|---|
| Firing Temperature (°C) | | 1325 | 1300 | 1350 | — | — |
| Firing Contraction Coefficient (%) | | 11.60 | 16.02 | 13.81 | — | — |
| Bulk Specific Gravity | | 3.40 | 4.18 | 3.85 | — | 3.6 |
| Apparent Specific Gravity | | 3.41 | 4.18 | 3.85 | 3.7 | — |
| Intrinsic Volume Resistivity (MΩ) | | $7.5 \times 10^{13}$ | $1.2 \times 10^{14}$ | $1.1 \times 10^{14}$ | $>10^{14}$ | $>10^{14}$ |
| Dielectric Constant (1MHz) | | 9.2 | 10.2 | 9.7 | 8.8 | 9.0 |
| Thermal Expansion Coefficient ($10^{-6}$/°C) | 25 – 100° C | 2.4 | 3.0 | 3.0 | — | — |
| | 25 – 200° C | 2.7 | 3.3 | 3.2 | — | — |
| | 25 – 300° C | 2.9 | 3.6 | 3.4 | 4.3 | — |
| | 25 – 400° C | 3.1 | 3.8 | 3.6 | — | 6.5 |
| | 25 – 500° C | 3.3 | 3.9 | 3.7 | 4.5 | — |
| Thermal Conductivity Cal.$cm^{-1}s^{-1}$°$C^{-1}$ | 25° C | 0.024 | 0.035 | 0.033 | 0.019 | 0.04 |
| | 100° C | 0.035 | 0.035 | 0.025 | 0.016 | 0.032 |
| Flexural Strength (kg.$cm^{-2}$) | | 2064 | 2310 | 2500 | 1540 | 3000 |
| Young's Modulus ($10^6$ kg.$cm^{-2}$) | | 1.10 | 1.85 | 1.83 | 1.62 | 2.7 |
| Poisson's Ratio | | 0.23 | 0.24 | 0.24 | 0.25 | 0.22 |
| Vicker's Hardness | | 1103 | 1183 | 1100 | — | 1350 |

What is claimed is:

1. A process for preparing a ceramic material having a thermal expansion coefficient close to that of silicon comprising:
   (a) forming a mixture of powders consisting essentially of:
   (i) zircon;
   (ii) 5.00 – 30.00% by weight of a calcined clay selected from the group consisting of calcined ball clay, calcined kaolin clay and mixtures thereof; and
   (iii) an additive selected from the group consisting of
   1.00 – 5.00% by weight of $Li_2O$,
   1.00 – 10.00% by weight of $TiO_2$, and
   2.00 – 10.00% by weight of $ZnZrSiO_5$, calculated on a ZnO basis;
   (b) molding the mixture; and
   (c) firing the molded mixture at a temperature in the range of 1200° to 1450° C.

2. The process of claim 1 wherein the mixture consists essentially of:
   6.00 – 25.00% by weight of calcined kaolin clay;
   1.50 – 2.00% by weight of $Li_2O$; and
   the balance being zircon,
and wherein said firing temperature is in the range of 1300° to 1350° C.

3. The process of claim 1 wherein the mixture further contains CoO and consists essentially of:
   6.00 – 25.00% by weight of calcined kaolin clay:
   3.50 – 5.50% by weight of $ZnZrSiO_5$, calculated on a ZnO basis;
   3.50 – 8.00% by weight of CoO; and the balance being zircon,
and wherein said firing temperature is in the range of 1200° to 1350° C.

4. The process of claim 1 wherein the mixture further contains MgO and consists essentially of:
   6.00 – 2500% by weight of calcined kaolin clay;
   1.90 – 3.80% by weight of $TiO_2$;
   1.10 – 2.50% by weight of MgO; and
   the balance being zircon,
and wherein said firing temperature is in the range of 1250° to 1400° C.

5. A process for preparing a ceramic material having a thermal expansion coefficient close to that of silicon comprising:
   (a) forming a mixture of powders consisting essentially of:
      (i) zircon;
      (ii) 5.00 – 30.00% by weight of a calcined clay selected from the group consisting of calcined ball clay, calcined kaolin clay and mixtures thereof;
      (iii) a first additive selected from the group consisting of
         1.00 – 5.00% by weight of $Li_2CO_3$, calculated on a $Li_2O$ basis,
         1.00 – 10.00% by weight of $TiO_2$, and
         2.00 – 10.00% by weight of ZnO; and
      (iv) a second additive selected from the group consisting of
         2.00 – 15.00% by weight of CoO,
         2.00 – 15.00% by weight of $Co_2O_3$,
         2.00 – 15.00% by weight of $Co_3O_4$, and
         1.00 – 5.00% by weight of MgO;
   (b) molding the mixture; and
   (c) firing the molded mixture at a temperature in the range of 1200° to 1450° C.

6. A process for preparing a ceramic material having a thermal expansion coefficient close to that of silicon comprising:
   (a) forming a mixture of powders consisting essentially of:
      (i) zircon;
      (ii) 6.00 – 25.00% by weight of a calcined clay selected from the group consisting of calcined ball clay, calcined kaolin clay and mixtures thereof; and
      (iii) an additive selected from the group consisting of
         1.50 – 2.00% by weight of $Li_2O$,
         1.90 – 3.80% by weight of $TiO_2$, and
         3.50 – 5.50% by weight of $ZnZrSiO_5$, calculated on a ZnO basis;
   (b) molding the mixture; and
   (c) firing the molded mixture at a temperature in the range of 1200° to 1400° C.

7. A process for preparing a ceramic material having a thermal expansion coefficient close to that of silicon comprising:
   (a) forming a mixture of powders consisting essentially of:
      (i) zircon;
      (ii) 6.00 – 25.00% by weight of a calcined clay selected from the group consisting of calcined ball clay, calcined kaolin clay and mixtures thereof;
      (iii) a first additive selected from the group consisting of
         1.50 – 2.00% by weight of $Li_2CO_3$, calculated on a $Li_2$ cl basis,
         1.90 – 3.80% by weight of $TiO_2$, and
         3.50 – 5.50% by weight of ZnO; and
      (iv) a second additive selected from the group consisting of
         3.50 – 8.00% by weight of CoO,
         3.50 – 8.00% by weight of $Co_2O_3$,
         3.50 – 8.00% by weight of $Co_3O_4$, and
         1.10 – 2.50% by weight of MgO;
   (b) molding the mixture; and
   (c) firing the molded mixture at a temperature in the range of 1200° to 1400° C.

8. A process for preparing a ceramic material having a thermal expansion coefficient close to that of silicon comprising:
   (a) forming a mixture of powders consisting essentially of:
      (i) zircon;
      (ii) 5.00 – 30.00% by weight of clay selected from the group consisting of ball clay, kaolin clay and mixtures thereof; and
      (iii) an additive selected from the group consisting of
         1.00 – 5.00% by weight of $Li_2O$,
         1.00 – 5.00% by weight, calculated on a $Li_2O$ basis, of a compound which yields $Li_2O$ upon firing,
         1.00 – 10.00% by weight of $TiO_2$,
         1.00 – 10.00% by weight, calculated on a $TiO_2$ basis, of a compound which forms $TiO_2$ upon firing,
         2.00 – 10.00% by weight of $ZnZrSiO_5$, calculated on a ZnO basis, and
         2.00 – 10.00% by weight, calculated on a ZnO basis, of a compound other than $ZnZrSiO_5$ which yields ZnO upon firing;
   (b) molding the mixture; and
   (c) firing the molded mixture at a temperature in the range of 1200° to 1450° C.

* * * * *